United States Patent [19]

Yanagisawa

[11] Patent Number: 4,651,306
[45] Date of Patent: Mar. 17, 1987

[54] DYNAMIC MEMORY

[75] Inventor: Kazumasa Yanagisawa, Tanashi, Japan

[73] Assignee: Hitachi, Ltd., Tokyo, Japan

[21] Appl. No.: 858,562

[22] Filed: Apr. 24, 1986

Related U.S. Application Data

[63] Continuation of Ser. No. 640,449, Aug. 13, 1984, abandoned.

[30] Foreign Application Priority Data

Oct. 17, 1983 [JP] Japan ................................ 58-192366

[51] Int. Cl.⁴ ........................ G11C 13/00; G11C 11/40
[52] U.S. Cl. ................................... 365/210; 365/149; 365/189; 365/154
[58] Field of Search ............... 365/149, 182, 189, 190, 365/207, 210, 154

[56] References Cited

U.S. PATENT DOCUMENTS 4,493,056  1/1985  Mao ..................................... 365/149
4,547,868 10/1985  Childers et al. ..................... 365/210

OTHER PUBLICATIONS

"Sense Amplifier Design is Key to 1-Transistor Cell in 4,096-Bit Ram" Kuo et al., *Electronics*, Sep. 1973, pp. 116–121.

*1972 IEEE International Solid-State Circuits Conference* "Digent of Technical Papers", Feb. 1972, Storage Array and Source/Refresh Circuit for Single-Transistor Memory Cells, K. U. Stein et al., pp. 56–57.

*IEEE Journal of Solid-State Circuits*, vol. SC15, No. 5, Oct. 1980, "A 100 ns 5 V Only 64K1 MOS Dynamic RAM" Chan et al., pp. 839–846.

*Primary Examiner*—Terrell W. Fears
*Attorney, Agent, or Firm*—Antonelli, Terry & Wands

[57] ABSTRACT

When half-size dummy cells are used in a dynamic memory, it is difficult to increase the relative accuracy of the capacitors in the half-size dummy cells and the capacitors in memory cells. According to the present invention, a pair of full-size dummy cells is provided connected to a pair of bit lines. High-level and low-level signals amplified by the sense amplifier are written into the full-size dummy cells, the capacitors of the pair of full-size dummy cells are then short-circuited by a short-circuiting circuit, and the electric charges in the capacitors provide a reference level. This method does not need a generator circuit providing a voltage of $\frac{1}{2}$ $V_{CC}$ ($V_{cc}$: power-source voltage) which would necessitate a large quantity of power to drive it.

28 Claims, 9 Drawing Figures

DYNAMIC MEMORY

This application is a continuation of application Ser. No. 640,449 filed 8-13-84 and now abandoned.

BACKGROUND OF THE INVENTION

The present invention relates to a technique that can be effectively adapted to semiconductor and other memory devices, and in particular relates to a technique that can be effectively utilized, for example, in a semiconductor dynamic memory device which has folded bit lines.

Japanese Patent Publication No. 39073/1980 discloses a dynamic random-access memory (hereinafter referred to as a DRAM) provided with folded bit lines.

A system has been proposed for a DRAM in which data is read from memory cells by utilizing dummy cells (or dummy memory cells) of a capacity approximately half that of the memory cells, i.e., by utilizing dummy cells (hereinafter referred to as half-size dummy cells) which have reference capacitors of a capacity about half that of capacitors used for storing data.

With a memory circuit of this type, a bit data stored in the memory cell is detected by a differential sense amplifier which compares potentials which vary according to the quantity of electric charge stored in the memory cell and the dummy cell.

According to studies conducted by the inventors, however, it has been found that it is virtually impossible to manufacture half-size dummy cells with the same process variation of that of memory cells, so that a problem concerning accuracy remains. On the other hand, it has been found that the dummy cells should be of the same size as the memory cells, i.e., each of the dummy cells (hereinafter referred to as full-size dummy cells) should be provided with a reference capacitor of a capacity substantially equal to that of the capacitor used for storing data in a memory cell. A variety of memories have been proposed employing full-size dummy cells, but these waste large quantities of power in the resetting of the dummy cells, and their sensing speed is low.

The inventors have studied these problems, and have contrived a memory device employing full-size dummy cells based upon an extremely novel idea.

SUMMARY OF THE INVENTION

An object of the present invention is to provide a memory device which enables an increase in a relative accuracy of the capacities of memory cells and full-size dummy cells.

Another object of the present invention is to provide a memory device which consumes a reduced quantity of power.

Still another object of the present invention is to provide an integrated circuit memory device which can be manufactured easily.

A further object of the present invention is to provide an integrated circuit memory device which has full-size dummy cells that enable the wiring of the dummy cell portion of the device to be simplified.

Other object of the present invention is to provide an integrated circuit memory device which has full-size dummy cells, and which enables a so-called cold start without the need of preparation cycles (usually eight cycles) setting the initial conditions when the power source circuit is closed.

Other object of the present invention is to provide an integrated circuit memory device which performs a high-speed reading operation.

Other object of the present invention is to provide an integrated circuit memory device which has full-size dummy cells that enable the layout of the dummy cell portion of the device to be designed easily.

These and other objects as well as novel features of the present invention will become obvious from the following description in conjunction with accompanying drawings.

A representative embodiment of the invention disclosed in the specification is briefly described below.

A pair of dummy cells are short-circuited so that they are connected parallel to each other. This means that the electric charge stored in capacitors of these full-size dummy cells is divided into two, so that it is thus possible to obtain an integrated circuit memory device provided with full-size dummy cells which have the same function as that of conventional half-size dummy cells.

DESCRIPTION OF THE PREFERRED EMBODIMENTS

Embodiment 1

Figure 1:
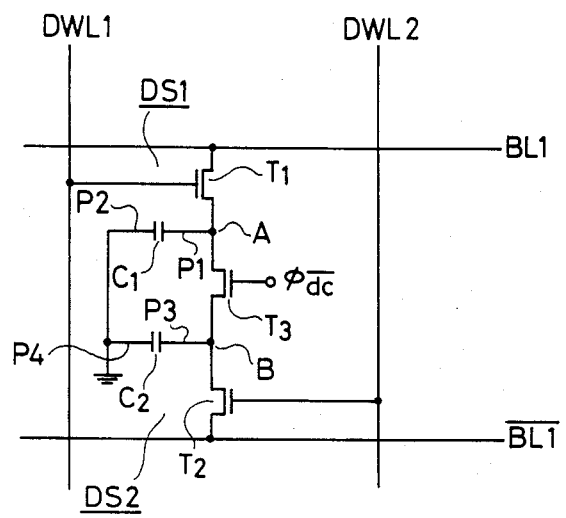
FIG. 1 is a circuit diagram of dummy memory cells according to a first embodiment of the present invention.

In the following description, insulated gate field effect transistors (hereinafter reffered to as MOSFETs) MOSFETs are all of the enhancement type unless stated otherwise. In the drawings, identical or corresponding portions are denoted by the same reference symbols.

FIG. 1 is a circuit diagram of dummy memory cells according to a first embodiment of the present invention, in which the symbols BL1 and $\overline{BL1}$ denote a pair of complementary bit lines, DWL1 and DWL2 denote dummy word lines, T1 and T2 denote n-channel MOSFETs for reading, T3 denotes an n-channel MOSFET for shortcircuiting dummy capacitors (dummy cells), C1 and C2 denote capacitors forming dummy memory cells, and A and B denote nodes.

Although not specifically limited thereto, a folded bit line system is employed for a memory array MARY of FIG. 2 which will be described later.

The pair of bit lines BL1 and $\overline{BL1}$ extend parallel to each other, are formed as a unitary structure together with bit lines of the memory array MARY.

A dummy memory cell DS1 connected to the bit line BL1 consists of the MOSFET T1 and the capacitor C1, and a dummy memory cell DS2 connected to the bit line BL1 consistos of the MOSFET T2 and the capacitor C2.

The dummy memory cells DS1 and DS2 form a pair. The capacitors C1 and C2 have capacitances that are substantially equal to those of capacitors constituting the memory cells. The circuit is shown schematically in FIG. 1. It should be understood that, of plates of the capacitors C1 and C2, that are not connected to nodes A and B i.e. plates P2 and P4 are connected to a grounding point of the circuit, as shown in FIG. 1, for reasons concerning the circuit operation. However, grounding the plates P2 and P4 means that they are maintained at a predetermined constant potential. According to a structure that will be described later with reference to FIGS. 5 to 7, the plates P2 and P4 of the capacitors C1 and C2 are maintained at the level of the power-source voltage.

Figure 2:
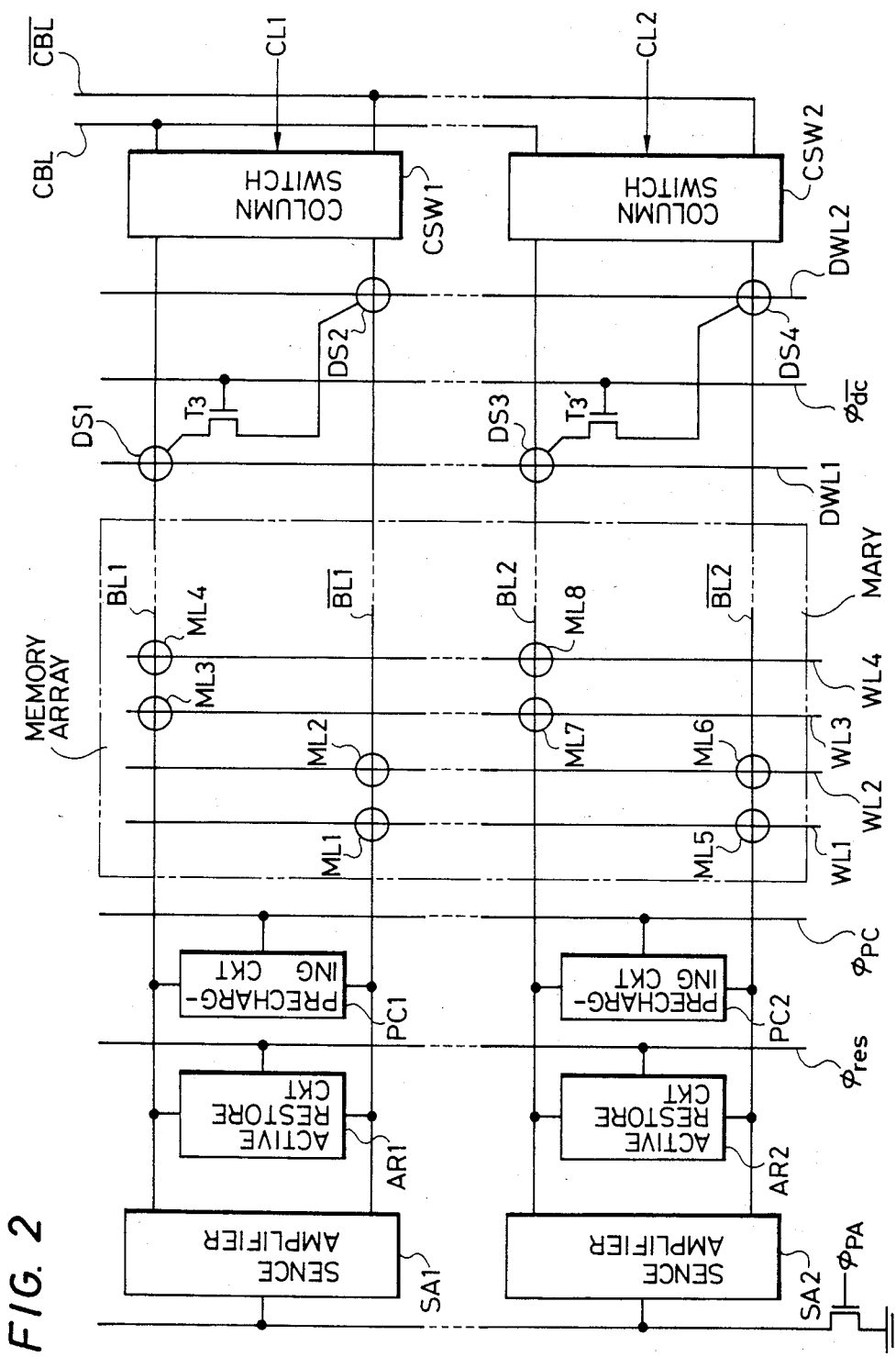
FIG. 2 is a block diagram of a memory array and relating circuits.

In FIG. 2, the memory array MARY consists of a plurality of pairs of bit lines BL1 to BL2 that extend parallel with one another, a plurality of word lines WL1 to WL4 that extend at right angles to the bit lines, and a plurality of memory cells ML1 to ML8.

In the memory array MARY, which has a folded bit line construction, a word line, for example word line WL1, crosses both of a pair of bit lines, e.g., crosses both of the pair of bit lines BL1 and $\overline{BL1}$. One memory cell, for example memory cell ML1, is arranged at one of the two intersection points between the word line WL1 and the pair of bit lines BL1 and $\overline{BL1}$. Although there is no particular limitation thereon, when the bit lines are constituted by electrically-conductive layers that extend over element-forming regions on top of an insulating film, in order to maximize the element-forming regions on the semiconductor substrate or reduce the area of the semiconductor substrate, data input/output terminals of two neighboring memory cells are constructed in common, and are connected to the data line corresponding thereto. Therefore the memory cells are arranged as shown in FIG. 2. This structure helps reduce the number of contact portions required between the memory cells and the data lines.

Equal numbers of memory cells are connected to each of the pair of bit lines, in order to make same parasitic capacitance of each bit lines. When one word line is selected, therefore, unwanted potential variations or noise imparted to each of the bit lines through the parasitic capacitance between the selected word line and the bit lines that intersect that word line is kept at the same level. In a memory of a folded bit line construction, the noise imparted to the pairs of bit lines when a word line is selected is virtually ignored by the sense amplifier, since the noise is common mode noise.

Sense amplifiers SA1, SA2, active-restore circuits (or active pull-up circuits) AR1, AR2, and precharging circuits PC1 and PC2, are connected to the pairs of bit lines BL1, $\overline{BL1}$, BL2 and $\overline{BL2}$, respectively, as shown in FIG. 2. Column switches CSW1 and CSW2 are provided between the pairs of bit lines and common bit lines CBL and $\overline{CBL}$, respectively.

The circuit of FIG. 2 is formed on a semiconductor substrate together with various other circuits that are not shown. A memory is thus constituted on the semiconductor substrate.

Although there is no particular limitation thereon. The memory of this embodiment is of an address multiplex type. Therefore, in addition to the circuits shown in FIG. 2, the semiconductor substrate also supports address buffers, a row address decoder, a word driver which receives an output from the row address decoder and forms word line select signals that are supplied to the word lines WL1 to WL4, a column address decoder which forms select signals that are supplied to the column switches CSW1 and CSW2, a main amplifier which amplifies data signals supplied over the common bit lines CBL and $\overline{CBL}$, an output buffer which receives an output from the main amplifier, dummy word line select circuits which form dummy word line select signals that are supplied to the dummy word lines DWL1 and DWL2, and a timing generator which receives a $\overline{RAS}$ (row address strobe) signal, a $\overline{CAS}$ (column address strobe) signal, and a $\overline{WE}$ (write enable) signal, and which forms various timing signals to control the operations of all these circuits. Most of these circuits can be formed in substantially the same manner as those of the memory of the well-known address multiplex system, so detailed constructions of these circuits are not described here.

Figure 7:
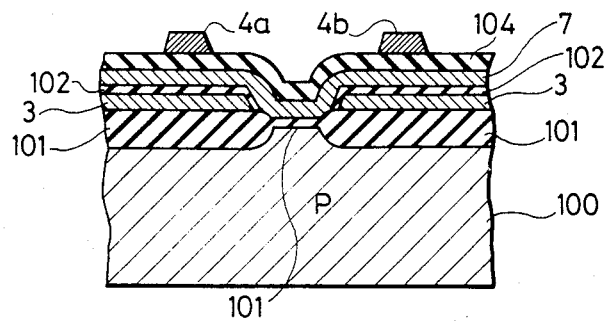

The timing of changes in select signals applied to the dummy word lines DWL1, DWL2 of this embodiment is slightly different from that of the conventional art, as will be obvious from the timing chart of FIG. 7. One of the two dummy word lines DWL1 and DWL2 reaches select level at the same time as one of the word lines in the memory array MARY reaches select level, and the other dummy word line reaches select level after the sense amplifiers SA1 and SA2 are operated by the timing signal $\phi_{pa}$. The dummy word line select signals can be generated by slightly modifying a delay circuit that receives timing signals $\phi_{pa}$, and by slightly modifying the dummy word line select circuit.

Figure 3:
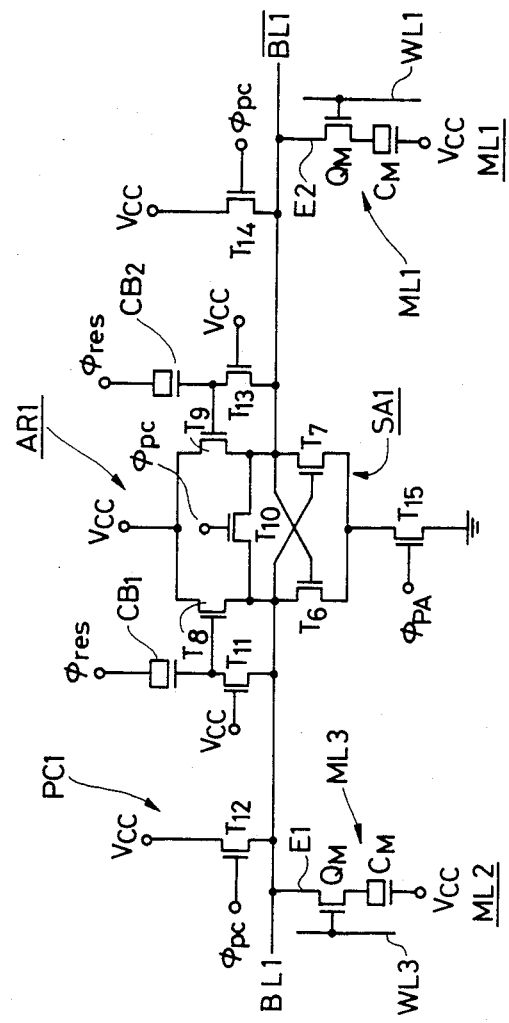
FIG. 3 is a circuit diagram of a specific embodiment of a memory cell, sense amplifier, active-restore circuit, and precharging circuit.

FIG. 3 is a circuit diagram of a specific sense amplifier and memory cells used for reading the memory according to this embodiment, wherein symbols T6 to T15 denote n-channel MOSFETs, BL1 and $\overline{BL1}$ denote complementary bit lines, and CB1 and CB2 denote capacitors for boosting the bit lines. Symbol $\phi_{PA}$ denotes a sense amplifier control signal, $\phi_{PC}$ denotes a precharging signal, and $\phi_{res}$ denotes an active-restore control signal compensating for any drop in level of a high-level bit line due to sensing.

The sense amplifier SA1 consists of a pair of MOSFETs T6 and T7 whose gates and drains are connected in a cross-coupled manner. The operation of the sense amplifier SA1 is controlled by the MOSFET T15 which is supplied with the sense amplifier control signal $\phi_{PA}$ through its gate.

The active-restore circuit AR1 consists of the MOSFETs T8, T9, T11, T13, and the boosting capacitors CB1 and CB2. The boosting capacitors CB1 and CB2 are constructed in substantially the same manner as the MOSFETs, so that each of the boosting capacitors CB1 and CB2 has an electrode (hereinafter referred to as the first electrode) that corresponds to the gate of a MOSFET and an electrode (hereinafter referred to as the second electrode) that corresponds to the source and drain electrodes of a MOSFET. The first electrodes of the capacitors CB1 and CB2 are connected to the MOSFETs T8, T11, T9 and T13, as shown in FIG. 3.

Since the capacitors CB1 and CB2 are constructed in the same manner as the MOSFETs, the capacitors CB1 and CB2 act effectively as variable capacitors. The capacitance between each first electrode and second electrode is very small if the first electrode is at a low level close to zero. In this case, since the mutual coupling between the first electrode and the second electrode is weak, the potential of the first electrode does not change much even when the control signal $\phi_{res}$ is applied to the second electrode. The capacitance between the first electrode and the second electrode rises to a relatively large value if the first electrode is at a potential which is higher than a threshold voltage thereof. In this case, the potential of the first electrode changes in response to the control signal $\phi_{res}$ when it is applied to the second electrode. This means that a selective bootstrap voltage can be formed.

The precharging circuit PC1 consists of precharging MOSFETs T12 and T14 provided between a power-source terminal $V_{CC}$ and the bit lines BL1, $\overline{BL1}$, respectively and an equalizing MOSFET T10 provided between the bit line BL1 and the bit line $\overline{BL1}$.

Each of the memory cells ML1 and ML3 consists of an n-channel MOSFET $Q_M$ for selecting the address, and a capacitor $C_M$ for storing data. Electrodes controlled by an selection signal or drain electrodes E1 and E2 of the address selecting MOSFETs, are connected to the bit line BL1 or $\overline{BL1}$, and the gate electrodes are connected to the word line WL3 or WL1. The gate electrodes of the address-selecting MOSFETs constitute select terminals of the memory cells, and the electrodes E1 and E2 constitute data input/output terminals of the memory cells. In this embodiment, the capacitor C1 of FIG. 1 and the capacitor $C_M$ in the memory cell occupy approximately the same area so that they have approximately the same capacity. The capacitor C1 in the dummy memory cell and the capacitor $C_M$ in the memory cell are manufactured by the same manufacturing steps, as in a conventional dynamic RAM. This structure enables a high degree of relative accuracy between the capacitors C1 and $C_M$.

Namely, as is well known, capacitors constituted in the form of an integrated circuit are obtained by repeating a selective processing technique a plurality of times, utilizing a masking film such as photoresist film. In this case, however, the effective electrode areas of the capacitors C1 and $C_M$ are subject to unwanted variations, depending upon errors in aligning the mask. If the size of capacitor C1 in the dummy memory cell is smaller than that of capacitor $C_M$, any variation in the capacitance of capacitor C1 due to masking error is greater than that of capacitor $C_M$, so that the relative accuracy of the capacitors C1 and $C_M$ decreases. On the other hand, when the capacitors C1 and $C_M$ have nearly the same size, any variation in the capacitance of capacitor C1 is approximately equal to a similar variation in the capacitance of capacitor $C_M$, so that the relative accuracy of the capacitors C1 and $C_M$ is sufficiently increased.

When data is to be read out from the dynamic memory cell consisting of one MOSFET per cell, as in this embodiment, the potential of one of the pair of bit lines is set according to the data stored in the selected memory cell. The potential of the bit line is determined by the distribution of electric charge between the bit line and the selected memory cell. The bit lines of this embodiment have a parasitic capacitance that is much greater than the capacitance of capacitors $C_M$ of the memory cells, like in an ordinary dynamic RAM. Therefore the selected memory cell imparts only a very small potential change of very small reading voltage amplitude to the bit line. In order to distinguish between high-level and low-level voltages of such a small amplitude, the dummy memory cell applies a reference voltage to the other bit line of the pair of bit lines. Thus, the pair of bit lines are precharged by the initial operation of the precharging circuit to reach the same potential. Then, a small voltage corresponding to the data stored in the memory cell is applied between the pair of bit lines in accordance with starting of selection of the memory cell and the dummy memory cell, and this small voltage is amplified by the sense amplifier.

The reference voltage is determined by the distribution of electric charge between the capacitor in the dummy cell and a bit line to which the capacitor is connected. The reference voltage must be as accurate as possible so that the difference in levels of the pair of bit lines can be amplified sufficiently, and the difference in levels of the pair of bit lines can increase to a predetermined level difference within a short period of time when the sense amplifier is operated, or in other words, so that the data can be read out without error at high speed.

Therefore the relative accuracy of the capacitor in the dummy memory cell and the capacitor in the memory cell must be sufficiently high.

Figure 4:
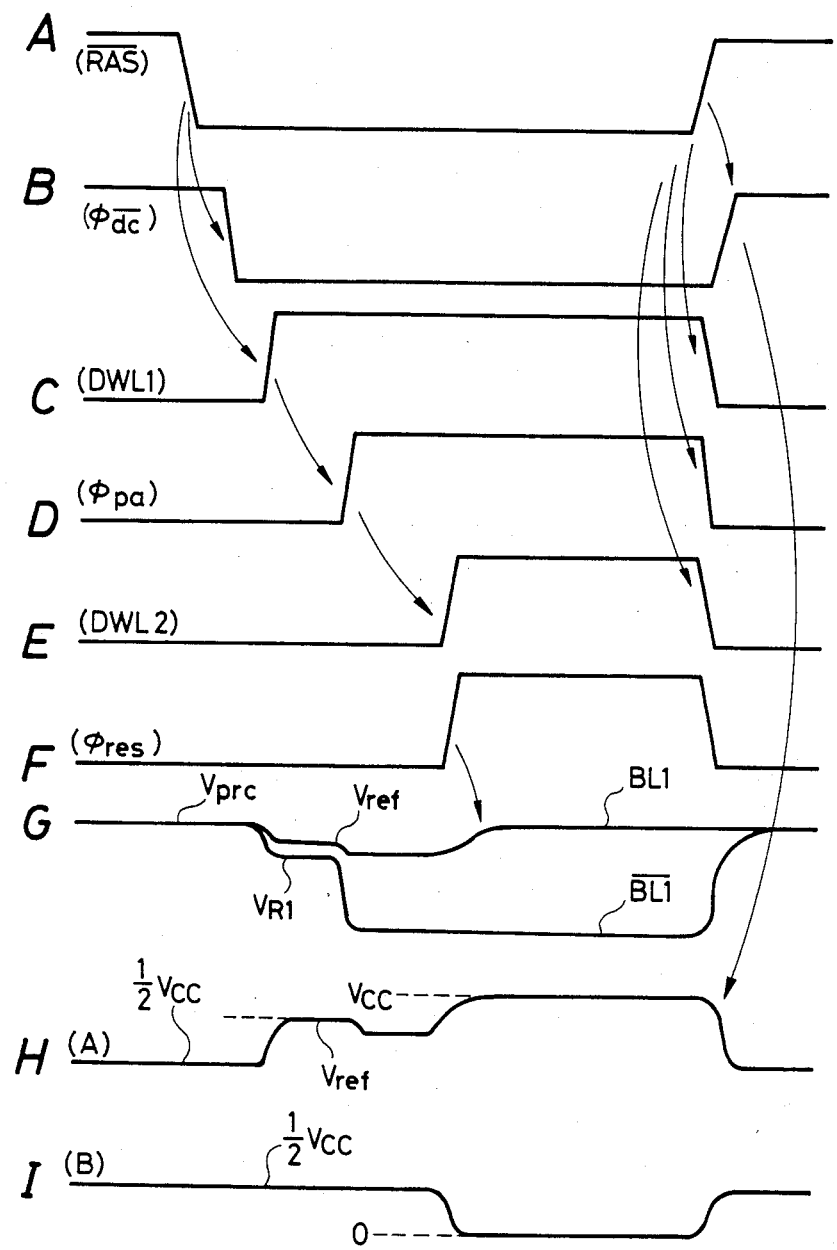
FIG. 4(A–I) is a timing chart of the reading operation of the memory.

FIG. 4 is a timing chart of the memory circuit of the present invention. The operation of the memory of this embodiment (refer to FIGS. 1, 2 and 3) will be described below with reference to the timing chart of FIG. 4.

In the following description, it is assumed for convenience that an address signal selecting word line WL1 is supplied to the memory. In other words, an address signal is supplied to select memory cell ML1 connected to bit line $\overline{BL1}$. Therefore, when that word line is selected, dummy word line DWL1 is selected such that the reference potential is applied to bit line BL1.

A discharge signal (dummy cell short-circuit signal) $\phi_{dc}$ rises when the row address strobe signal $\overline{RAS}$ rises to a high level which is nearly equal to the power-source voltage $V_{CC}$, so that the switch T3 in FIG. 1 is turned on. At the same time, the charge stored in the capacitors C1, C2 becomes exactly half that stored in answer to the corresponding memory cell storing a data "1", as will be described later. The precharge signal $\phi_{pc}$ rises to high level because the $\overline{RAS}$ signal is at high level. Therefore, the precharging circuits PC1, PC2 operate, and the bit line BL1 or $\overline{BL2}$ is precharged to a high level, $V_{prc}$, as shown in FIG. 4G. The precharge level $V_{prc}$ can be considered to be virtually equal to $V_{CC}$ (where $V_{CC}$ is the power-source voltage).

When the $\overline{RAS}$ signal falls, as shown in FIG. 4A, the precharge signal $\phi_{pc}$ falls correspondingly, so that the operation of the precharging circuits PC1, PC2 stops. In other words, MOSFETs T12, T13 and T10 of FIG. 3 are turned off.

The dummy cell short-circuit signal $\phi_{dc}$ falls in synchronism with the fall of the $\overline{RAS}$ signal, as shown in FIG. 4B, turning the switching MOSFET T3 off.

A dummy word line select circuit (which is not shown) starts to operate in synchronism with the fall of the $\overline{RAS}$ signal. Part of the address signal is supplied to the dummy word line select circuit as a discrimination signal for the memory cell that will be connected to a pair of bit lines. Therefore, when the address signal specifies word line WL1, the potential of the dummy word line DWL1 rises in synchronism with the fall of the $\overline{RAS}$ signal, as shown in FIG. 4C. Since the switching MOSFET T1 is rendered to on state, the capacitor C1 in dummy memory cell DS1 is connected to bit line BL1 which has been precharged to a high level. As a result, the potential of the bit line BL1 changes from the precharge level $V_{prc}$ to a reference potential level $V_{ref}$, as shown in FIG. 4G.

The timing for selecting the word line WL1 is virtually the same as the timing for selecting the dummy word line DWL1. Therefore, when word line WL1 reaches high level, the capacitor $C_M$ in the memory cell corresponding to the data line $\overline{BL1}$, which is to be read out, is connected to the data line $\overline{BL1}$ which has been precharged to the high level, $V_{prc}$. If the data bit written into capacitor $C_M$ of the memory cell ML1 is "0", a read voltage VR1 applied to bit line $\overline{BL1}$ drops, when word line WL1 is selected out, as shown in FIG. 4G. Conversely, if the data bit is "1", the potential of the bit line $\overline{BL1}$ does not change much from the precharge level $V_{prc}$.

As will be described later, the voltage previously applied to capacitor C1 of dummy memory cell DS1 is equal to $V_{CC}/2$, so that the reference potential $V_{ref}$ has a value which lies between the precharge level $V_{prc}$ and the voltage VR1.

After the word line WL1 and dummy word line DWL1 reach high level, the sense amplifier control signal rises as shown in FIG. 4D. This turns the sense amplifier power switch T15 of FIG. 3 on, and the sense amplifier SA1 starts its sense operation. When this sense operation is started, the data line $\overline{BL1}$ rapidly drops to low level as shown in FIG. 4G, and the level of the data line BL1 drops slightly due to the initial sense operation. In other words, although this is not essential to the present invention, immediately after the start of the sense operation, the pair of MOSFETs T6 and T7 constituting the sense amplifier SA1 are not turned clearly on and off, since the potential difference between the pair of bit lines BL1 and $\overline{BL1}$ has not yet widened far enough. Therefore, the electric charge on the bit line that should reach high level is undesirably discharged through the sense amplifier SA1. This unwanted discharge stops when the pair of MOSFETs T6 and T7 are clearly turned on or off by the amplification of the potential difference between the pair of bit lines. The active-restore circuit AR1 is provided to compensate for any unwanted voltage drop in the bit lines. The potentials of bit lines BL1 and $\overline{BL1}$ are applied through cutting MOSFETs T11 and T13 to the boosting capacitors CB1 and CB2 in the active-restore circuit AR1.

Although there is no particular limitation thereon, the restore signal $\phi_{res}$ and the dummy word line DWL2 rise almost simultaneously after the sense amplifier control signal $\phi_{PA}$ rises, as shown in FIGS. 4F and 4E.

The boosting capacitor CB1 privides a boosting function since its first electrode is at high level in response to the rise of the bit line BL1. Therefore, when the restore signal $\phi_{res}$ is generated, the potential of the first electrode of the boosting capacitor CB1 rises to a high level that exceeds the power-source voltage $V_{CC}$. The MOSFET T8 is turned on enough by the boosted voltage applied through the boosting capacitor CB1, so that the potential of the bit line BL1 is restored to a level close to the power-source voltage, as shown in FIG. 4G.

On the other hand, the boosting capacitor CB2 has substantially no boosting function since its first electrode is at low level in response to the low level of the bit line $\overline{BL1}$. The gate potential of the MOSFET T9 does not change much even when the restore signal $\phi_{res}$ is generated, but remains at low level. Therefore, the potential of bit line $\overline{BL1}$ remains at low level as shown in FIG. 4G.

The MOSFET T2 in the dummy memory cell DS2 is turned on when the dummy word line DWL2 rises, as shown in FIG. 4E, so that the capacitor C2 in dummy memory cell DS2 is discharged in response to the low level of the bit line $\overline{BL1}$, which is close to zero volt. Hence the potential of capacitor C2 (node B of FIG. 1) changes as shown in FIG. 4I, and the potential of capacitor C1 (node A) changes as shown in FIG. 4H.

The dummy word line DWL1, the sense amplifier control signal $\phi_{pa}$, the dummy word line DWL2, the word lines corresponding to the desired memory cells, and the restore signal $\phi_{res}$ fall when the $\overline{RAS}$ signal rises as shown in FIG. 4A. At the same time, the precharging signal $\phi_{pc}$ is raised to make it ready to perform the next sense operation.

Although there is no particular limitation thereon, the dummy cell short-circuit signal $\overline{\phi_{dc}}$ rises in synchronism with the rise of the $\overline{RAS}$ signal after the data readout, and after the dummy word lines DWL1 and DWL2 have fallen, as shown in FIG. 4B. The short-circuiting MOSFET T3 between the dummy memory cells DS1 and DS2 is turned on when the signal $\phi_{dc}$ rises, and in response thereto, the capacitors C1 and C2 in the dummy memory cells DS1 and DS2 are short-circuited. The capacitors C1 and C2 have been charged to a high level which is close to the power-source voltage $V_{CC}$ and to a low level which is close to zero according to the levels of the bit lines BL1 and $\overline{BL1}$, during the period in which the MOSFETs T1 and T2 were on. Therefore, when the MOSFET T3 is turned on, a charge exactly equal to the precharged $\frac{1}{2} V_{CC}$ is stored in the capacitors C1 and C2.

Repeating this cycle ensures that the dummy capacitors always store a charge which is equal to half the power-source voltage $V_{CC}$ precharged by the preceding reading cycle. In other words, the result is the same as that when a dummy cell of capacity half that of the memory capacitor is precharged to $V_{CC}$, i.e., when a half-size dummy cell is precharged to $V_{CC}$.

Figure 5:
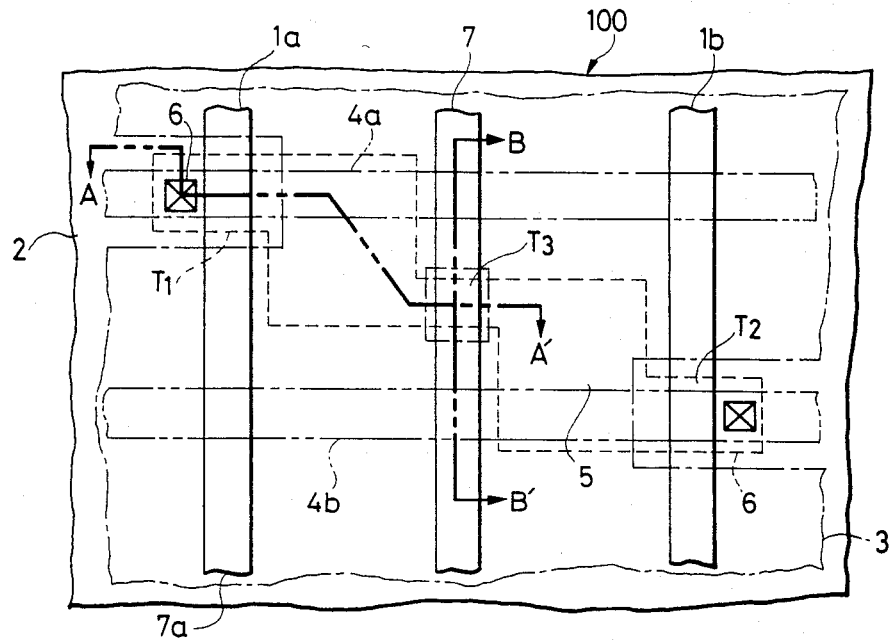
FIG. 5 is a plan view of the layout of dummy memory cells according to the first embodiment of the present invention.
Figure 6:
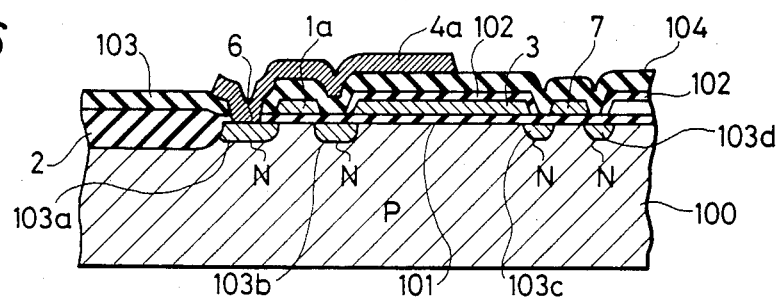
FIGS. 6 and 7 are a section view through the dummy cell taken along the line A–A' of FIG. 5, and a section view through the dummy cell taken along the line B–B' of FIG. 5.

FIG. 5 is a diagram which specifically illustrates the layout of the dummy cell portion. FIGS. 6 and 7 are a section taken along the line A–A' of FIG. 5, and a section taken along the line B–B' of FIG. 5, respectively. Although not specifically limited thereto, the device of this embodiment is produced by the techniques of selective oxidation and self-alignment utilizing polycrystalline silicon layers.

In FIGS. 5 to 7, reference numerals 1a and 1b denote dummy word lines formed by a second level polycrystalline silicon layer, 2 denotes a LOCOS oxide film, 3 denotes a first level polycrystalline silicon layer that forms one electrode of a capacitor, 4a and 4b denote aluminum layers that form data lines, 5 denotes a diffusion layer or an active region, 6 denotes contact portions between the diffusion layer and the aluminum data lines, and 7 denotes a second level polycrystalline silicon layer forming the gate electrode of the short-circuiting MOSFET T3.

The field oxide film 2 of a relatively large thickness is formed on the main surface of a semiconductor substrate 100 composed of p-type single crystalline silicon where no active region 5 is formed. In FIG. 5, the pattern of the active region 5 is indicated by the broken lines. An insulating film 101 of a small thickness is formed on the surface of the semiconductor substrate 100 where the active region 5 will be formed, to constitute a gate insulating film for the MOSFETs and a dielectric film for the various capacitors. A first level polycrystalline silicon layer 3, of a pattern indicated by the one dot chain lines in FIG. 5, is formed over the field insulating film 2 and the insulating film 101. A thin oxide film 102 is formed on the surface of the polycrystalline silicon layer 3 by the oxidation thereof, to act as an insulating film. Second level polycrystalline silicon layers 1a, 1b and 7, of patterns indicated by the solid lines in FIG. 5, are formed on the semiconductor substrate 100. N-type semiconductor regions 103a to 103d are formed on the surface of the semiconductor substrate 100 where the active region 5 will be formed, but at places that are not covered by the first and second level polycrystalline silicon layers, to form source and drain regions for the MOSFETs. These n-type semiconductor regions are formed by a method of implanting impurity ions, utilizing the first and second level polycrystalline silicon layers as masks for the introduction of the impurities.

A silicon oxide film 104 which will act as an intermediate insulating film is also formed on the main surface of the semiconductor substrate 100. Aluminum wiring layers 4a and 4b of patterns indicated by the two dotted chain lines in FIG. 5 are formed on the silicon oxide film 104. The aluminum wiring layers 4a and 4b are electrically connected to the n-type semiconductor regions through contact holed 6 formed in the silicon oxide film 104 and the oxide film 101.

In this embodiment, the capacitor in each of the dummy memory cells consists of the first polycrystalline silicon layer 3, the thin oxide film 101 formed thereunder, and an inversion layer (not shown) that is induced on the surface of the semiconductor substrate 100 when the power-source voltage $V_{CC}$ is applied to the polycrystalline silicon layer 3, in the same way as in the capacitor in a memory cell.

Embodiment 2

Figure 8:
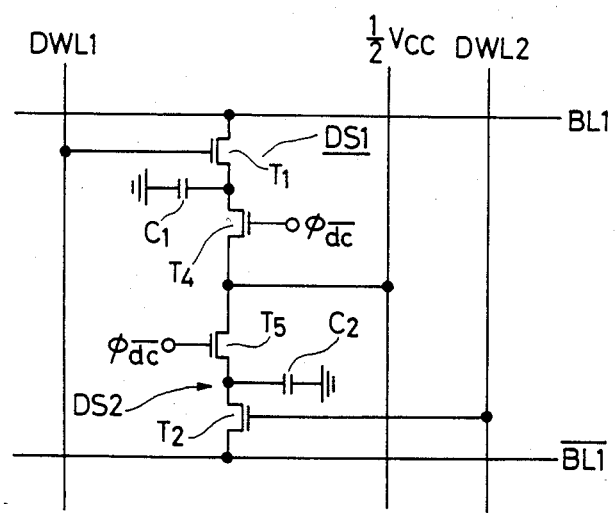
FIG. 8 is a circuit diagram of dummy cells according to a second embodiment.

FIG. 8 is a circuit diagram of specific dummy memory cells in a dynamic memory device according to a second embodiment of the present invention, wherein symbols T4 and T5 denote reading n-channel MOSFETs, and $\frac{1}{2} V_{CC}$ denotes a feeder line which supplies a potential half the power-source voltage $V_{CC}$.

A short-circuiting circuit consisting of the MOSFETs T4, T5 for short-circuiting the dummy cells' DS1 and DS2 and the capacitors C1, C2 in the dummy memory cells, according to this embodiment, has been designed so that the memory can be cold-started. A sense amplifier (not shown) is formed in the same manner as that of the first embodiment, so that FIGS. 3 and 4 should be consulted for derails of the sense amplifier and the timing chart.

The operation of the memory of the present invention will be described below in conjunction with these figures. However, the operation of this embodiment is nearly the same as that of the first embodiment, and hence only differences in the operation will be described in detail. When a power-source circuit is closed, a voltage is applied from the $\frac{1}{2} V_{CC}$ feeder line to the dummy capacitors C1, C2 through two separate short-circuiting MOSFETs T4 and T5. The reading operation is initiated in synchronism with the fall of the $\overline{RAS}$ signal. In the second and subsequent reading operations, an electric charge equal to the precharged at $\frac{1}{2} V_{CC}$ has already been stored in the dummy capacitors C1, C2 of FIG. 2 by the preceding reading operation. Therefore virtually no current flows thereto from the $\frac{1}{2} V_{CC}$ feeder line.

The voltage $\frac{1}{2} V_{CC}$ supplied to the $\frac{1}{2} V_{CC}$ line is formed by a not shown voltage generator circuit which receives the power-source voltage $V_{CC}$. Although there is no particular limitation thereon, the voltage generator circuit is formed on the semiconductor substrate together with the various circuits described with reference to the embodiment of FIG. 1, in order to prevent an increase in the number of external terminals of the memory. The voltage generator circuit can be constituted, for example, by a voltage divider which consists of resistance elements connected in series between the power-source terminal and the ground terminal, and an impedance converter circuit consisting of a sourcefollower MOSFET which receives the output of the voltage divider.

When a sufficiently low output impedance is required for the voltage generator circuit, the size of the MOSFET constituting the impedance converter circuit must be increased correspondingly.

According to this embodiment, the precharge level $\frac{1}{2} V_{CC}$ required for the ordinary operational cycles of the memory is obtained by substantially short-circuiting the dummy capacitors C1 and C2 by the MOSFETs T4 and T5. During the ordinary operational cycles of the memory, therefore, the voltage generator circuit needs to produce almost no driving power. The voltage generator circuit should have a driving power sufficient to precharge the dummy capacitors to the $\frac{1}{2} V_{CC}$ level over a relatively long period of time between when the power-source circuit is closed to when the memory starts to operate, so that the voltage generator circuit can have a relatively high output impedance. In other words, the MOSFET of the voltage generator circuit need have only a relatively small size.

Figure 9:
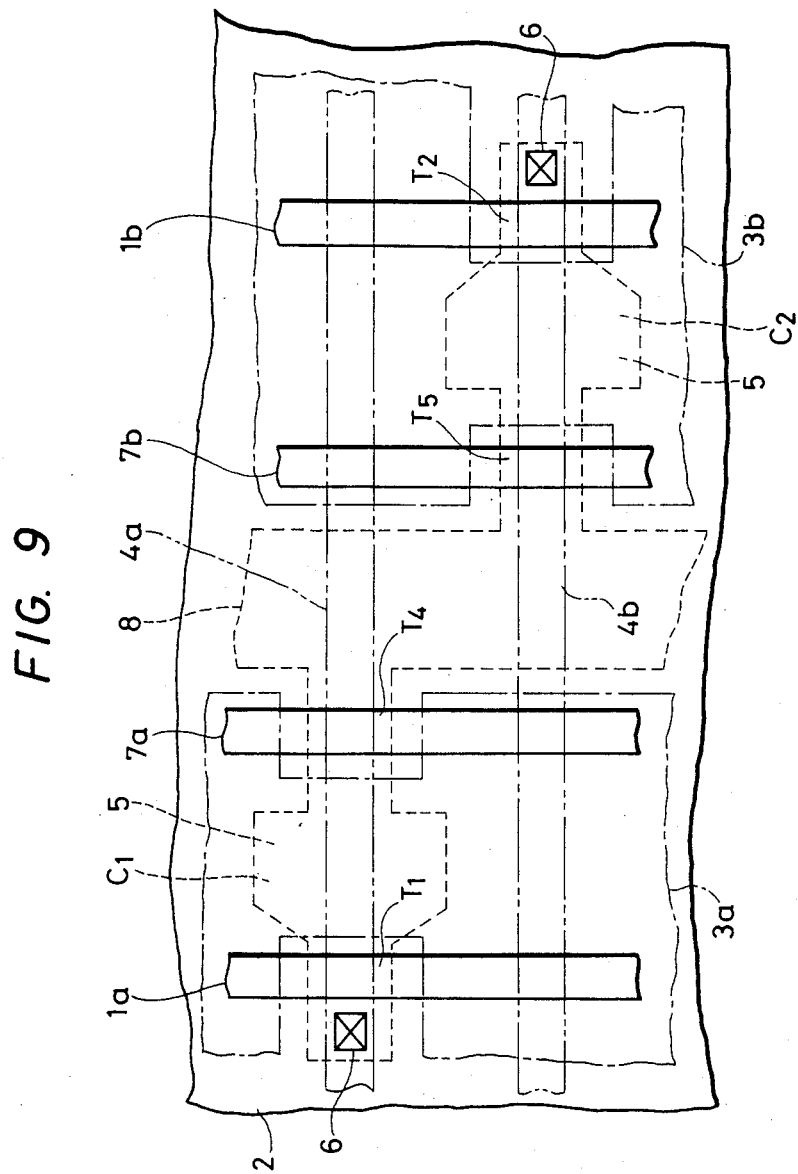
FIG. 9 is a plan view of the layout of dummy cells according to the second embodiment.

FIG. 9 is a plan view of the layout of dummy cells that corresponds to FIG. 8, and wherein reference numerals 1 to 7 denote the same components as those of FIG. 3, and 8 denotes a diffusion layer that acts as semiconductor wiring for supplying the voltage $\frac{1}{2} V_{CC}$.

In FIG. 9, an active regions 5 has a pattern as indicated by the broken lines. Second level polycrystalline silicon layers 7a and 7b are supplied with the dummy cell short-circuiting signal $\phi_{dc}$. First level polycrystalline silicon layers 3a and 3b are not formed over the semiconductor surface between the polycrystalline silicon layers 7a and 7b, so that the n-type semiconductor layer 8 is formed in the active region 5 on the surface.

According to this embodiment, aluminum layers 4a, 4b constituting the bit lines are continuous from aluminum layers that constitute bit lines of a memory array (not shown), and are arrayed at the same pitch as that of those aluminum layers. As shown in FIG. 9, the main portions of the dummy capacitors $C_1$ and C2 have a pattern resembling a baseball home base. The pattern of these main portions is substantially the same, and has the same size as that of the memory cells, which are not shown.

Effects

Since the pair of full-size dummy cells connected to the complementary bitlines are short-circuited, each memory capacitor and dummy capacitor can be formed to the same size. Therefore, any capacitance error between the two capacitors can be reduced, regardless of any variations in the manufacturing process, so that it is possible to provide a memory device of a smaller size.

The electric charge stored in the capacitor of the dummy cell during the preceding reading operation is utilized for the precharging operation of the next reading operation. Therefore, this memory device consumes less power than memory devices in which the bit lines are precharged to a level $V_{CC}$ to read data, and then the dummy memory cells are all discharged to a level $\frac{1}{2} V_{CC}$.

The sense amplifier responds without delay since the bit lines are precharged to $V_{CC}$. Therefore, data can be read at a higher speed than in memory devices in which the bit lines are precharged to $\frac{1}{2} V_{CC}$.

Since the memory cells and dummy cells are of substantially the same size, a minimum design dimension can be determined using the memory cells as a reference, and a memory with a high degree of integration can be designed with ease. In other words, when half-size dummy cells are used and an attempt is made to obtain dummy cells of a shape analogous to that of the memory cells, the minimum size is determined by the dummy cells. Therefore, the memory cells must have a large size, reducing the degree of integration. The shape of dummy cells is usually designed so that a minimum size the same as that of the memory cells can be used. Despite this, it is very difficult to realize the same variations during the manufacturing process as those affecting the memory cells.

Since the capacity of dummy cells varies only slightly, i.e., since any difference in capacity compared with respect a memory cell is small, there is no need to provide a margin to compensate for errors. Therefore the data can be read out at high speed.

No additional time is required since the fullsize dummy cells are precharged during the restoring of memory cells that are at "1", i.e., since two dummy cells are short-circuited and a half charge is distributed during the restoring of memory cells which are holding a data bit "1". Therefore it is possible to provide a memory device that reads data at high speed.

Since the voltage $\frac{1}{2} V_{CC}$ is always supplied to the dummy cells, no extra reading cycle (dummy cycle) initializing the dummy cells is required when the power-source circuit is closed, so that this dynamic memory device operates normally as soon as the power-source circuit is closed.

The pair of dummy capacitors coupled to the pair of complementary bit lines are short-circuited to form the precharge level $\frac{1}{2} V_{CC}$, so that during the actual reading operations (the second and subsequent reading cycles after the power-source circuit has been closed) almost no current flows to the $\frac{1}{2} V_{CC}$ feeder line. Therefore the areas occupied by the feeder circuit and its wiring can be reduced. For the same reasons, almost no current flows to set the initial conditions of the dummy cells, so that the memory device is free from the problem of potential variations in the power-source line due to intermittent currents.

As shown in FIG. 9, the layout of dummy cells can be made almost the same as that of the memory cells, to minimize variations in the manufacturing process. In the embodiment of FIG. 5, the corresponding dummy cells are arranged aslant for layout reasons, so that their shape is markedly different from that of the memory cells.

The invention accomplished by the inventors has been described above in detail by way of embodiments thereof. However, the present invention should in no way be limited to these embodiments, but can be variously modified within a range that does not depart from the gist thereof. For instance, the invention can be applied to a dynamic memory of the type in which grooves are formed in the memory cells to utilize the MOS capacity of the side surfaces thereof. To ensure that the memory device are not affected by any variations in the manufacturing process, it is desired that the capacitors C1 and C2 in each dummy cell have the same structure as the capacitor $C_M$ in the corresponding memory cell. For instance, all these capacitors should be MOS capacitors.

The above description has concerned the invention accomplished by the inventors which was adapted to a MOS dynamic semiconductor memory that acted as the background of the present invention. The present invention, however, is in no way limited thereto, but can be adapted to, for instance, switched capacitor filters. The present invention can be adapted to at least devices in which a plurality of capacitors are connected together to set initial conditions.

I claim:

1. A dynamic memory comprising:
   two bit lines extending on a semiconductor substrate;
   a plurality of memory cells connected to the bit lines, each memory cell having a capacitor for storing data in the form of electric charge;
   two further lines extending on said semiconductor substrate so as to intersect the bit lines;
   a first switching element connected between one of the bit lines and a first capacitor, the first switching element being controlled by a first one of the further lines;
   a second switching element connected between the other bit line and a second capacitor, the second switching element being controlled by the second further line; and
   a third switching element connected between the first and second capacitor,
   wherein the first and second capacitors are located between the two further lines.

2. A dynamic memory according to claim 1, wherein the third switching element is connected between the first and second capacitors so as to short-circuit those capacitors when it is in the on state.

3. A dynamic memory according to claim 1, wherein the third switching element comprises a first switch between the first capacitor and a reference potential line and a second switch between the second capacitor and the reference potential line, the switching of the first and second switches being synchronized.

4. A dynamic memory comprising:
   first and second capacitors, a first reference voltage being impressed between electrodes of each thereof during a first period to store a reference electric charge therein;
   a first switching element which is connected in series with said first capacitor, which is turned on during a second period after said first period has ended, and which remains on during a third period after said second period has ended;
   a first node which, when said first switching element is turned on during said second period, is impressed with a first reference potential corresponding to said reference electric charge from said first capacitor;
   a second node which constitutes a pair with said first node, and which is impressed with a potential that is to be detected during at least said second period;

a first circuit which applies potentials of complementary levels to said first node and second node during said third period;

a second switching element which is connected in series with said second node together with said second capacitor, and which is turned on during said third period;

a third node which is impressed with a second reference voltage which is substantially equal to said first reference voltage; and a switching circuit which is provided between said first and second capacitors and said third node, and which connects said first and second capacitors to said third node during a fourth period after said third period has ended;

wherein voltages between said electrodes of said first and second capacitors are set to said first reference voltage by the operation of said switching circuit.

5. A dynamic memory according to claim 4, wherein a precharging circuit is provided to precharge said first and second nodes to the same potential during said first period.

6. A dynamic memory according to claim 5, wherein said first switching element is provided between said first node and said first capacitor, and said second switching element is provided between said second node and said second capacitor.

7. A dynamic memory according to claim 6, wherein said first capacitor and said second capacitor have capacitances that are substantially equal to each other.

8. A dynamic memory according to claim 7, wherein a plurality of memory cells are provided, each consisting of a third capacitor and a third switching element provided between said third capacitor and said second node, wherein a potential that is to be detected is applied to said second node from said memory cell.

9. A dynamic memory according to claim 8, wherein said first circuit is comprised of a sense amplifier which amplifies the potential difference between said potential that is to be detected and said first reference potential that is applied to said first and second nodes.

10. A dynamic memory according to claim 9, wherein said first, second and third capacitors have capacitances that are substantially equal to one another.

11. A dynamic memory according to claim 9, wherein said first, second and third switching elements are comprised of of insulated gate field-effect transistors.

12. A dynamic memory according to claim 9, wherein said switching circuit comprises a fourth switching element provided between said first capacitor and said third node, and a fifth switching element provided between said second capacitor and said third node.

13. A dynamic memory according to claim 12, wherein said precharging circuit comprises a sixth switching element provided between a power-source terminal and said first node, and a seventh switching element provided between said power-source terminal and said second node.

14. A dynamic memory according to claim 13, wherein said precharging circuit comprises an eighth switching element provided between said first node and said second node.

15. A dynamic memory according to claim 12, wherein an active-restore circuit is connected to said first node and said second node.

16. A dynamic memory comprising:

a pair of first and second bit lines that extend parallel to each other on a semiconductor substrate;

a plurality of memory cells connected to said first and second bit lines, each of said memory cells being provided with a storage capacitor which stores data in the form of electric charge;

first and second select lines that extend over said semiconductor substrate in a direction crossing said first and second bit lines, one of said first and second select lines reaching a select level at a timing that is substantially equal to timing for selecting one of said plurality of memory cells, and the other select line being selected after said previous select line has been selected;

a reference potential line which is provided on said semiconductor substrate between said first select line and said second select line, and which is impressed with a reference potential which is greater than the ground potential of the circuit, but which is less than the power-source potential of said circuit;

a first capacitor provided on said semiconductor substrate between said first select line and said reference potential line;

a second capacitor provided on said semiconductor substrate between said second select line and said reference potential line;

a first switching element provided between said first bit line and a first electrode of said first capacitor, a switching operation thereof being controlled by said first select line;

a second switching element provided between said second bit line and a first electrode of said second capacitor, a switching operation thereof being controlled by said second select line;

a third switching element provided between said first electrode of first capacitor and said reference potential line; and a fourth switching element provided between said first electrode of said second capacitor and said reference potential line, a switching operation thereof being controlled in synchronism with that of said third switching element.

17. A dynamic memory according to claim 3, having means for applying a reference potential to the reference potential line, which reference potential is greater than ground potential but less than the power-source potential applied to the memory.

18. A dynamic memory according to claim 17, wherein the bit lines are substantially parallel.

19. A dynamic memory according to claim 17, wherein the capacitances of the capacitors in the memory cells and of the first and second capacitors are substantially equal.

20. A dynamic memory according to claim 19, wherein one of the further lines is selected at a time substantially equal to the time of selection of one of the memory cells, and the other is selected subsequently.

21. A dynamic memory according to claim 20, having an amplifier for generating a potential of a complementary level which is to be written into the first and second capacitors when the first and second further lines are respectively selected, and the third switching element is turned on after the amplifier has operated.

22. A dynamic memory according to claim 2, wherein the bit lines are substantially parallel.

23. A dynamic memory according to claim 22, wherein the capacitances of the capacitors in the memory cells and of the first and second capacitors are substantially equal.

24. A dynamic memory according to claim 23, wherein one of the further lines is selected at a time substantially equal to the time of selection of one of the memory cells, and the other is selected subsequently.

25. A dynamic memory according to claim 24, having an amplifier for generating a potential of a complementary level which is to be written into the first and second capacitors when the first and second further lines are respectively selected, and the third switching element is turned on after the amplifier has operated.

26. A dynamic memory according to claim 2, wherein the capacitances of the capacitors in the memory cells and of the first and second capacitors are substantially equal.

27. A dynamic memory according to claim 26, wherein one of the further lines is selected at a time substantially equal to the time of selection of one of the memory cells, and the other is selected subsequently.

28. A dynamic memory according to claim 27, having an amplifier for generating a potential of a complementary level which is to be written into the first and second capacitors when the first and second further lines are respectively selected, and the third switching element is turned on after the amplifier has operated.

* * * * *